(12) United States Patent
Liu

(10) Patent No.: US 8,199,871 B2
(45) Date of Patent: Jun. 12, 2012

(54) ELECTRONIC SYSTEM WITH SHIFT REGISTER

(75) Inventor: Ping-Lin Liu, Tainan (TW)

(73) Assignee: Chimei Innolux Corporation, Miao-Li County (TW)

( * ) Notice: Subject to any disclaimer, the term of this patent is extended or adjusted under 35 U.S.C. 154(b) by 31 days.

(21) Appl. No.: 12/955,686

(22) Filed: Nov. 29, 2010

(65) Prior Publication Data
US 2011/0135050 A1    Jun. 9, 2011

(30) Foreign Application Priority Data

Dec. 8, 2009    (TW) ............................... 98141855 A

(51) Int. Cl.
*G11C 19/00* (2006.01)
(52) U.S. Cl. ............................................ 377/64; 377/77
(58) Field of Classification Search ........................ None
See application file for complete search history.

(56) References Cited

U.S. PATENT DOCUMENTS

| | | | |
|---|---|---|---|
| 6,052,426 A | 4/2000 | Maurice | |
| 6,064,713 A | 5/2000 | Lebrun et al. | |
| 6,975,142 B2 * | 12/2005 | Azami et al. | 326/88 |
| 2007/0014390 A1 * | 1/2007 | Huang et al. | 377/64 |
| 2009/0033642 A1 * | 2/2009 | Chiang et al. | 345/204 |

\* cited by examiner

*Primary Examiner* — Tuan T Lam
(74) *Attorney, Agent, or Firm* — Thomas|Kayden

(57) ABSTRACT

An electronic system including a shift register is disclosed. The shift register includes a first transistor, a first trigger circuit, a second transistor, and a second trigger circuit. The first transistor receives a first input signal. The first trigger circuit is serially connected to the first transistor between a first level and a second level and is connected with the first transistor in a first node. The second transistor receives a second input signal inverted to the first input signal. The second trigger circuit receives the level of the first node, is serially connected to the second transistor between a third level and the second level, and is connected with the second transistor in a second node.

20 Claims, 14 Drawing Sheets

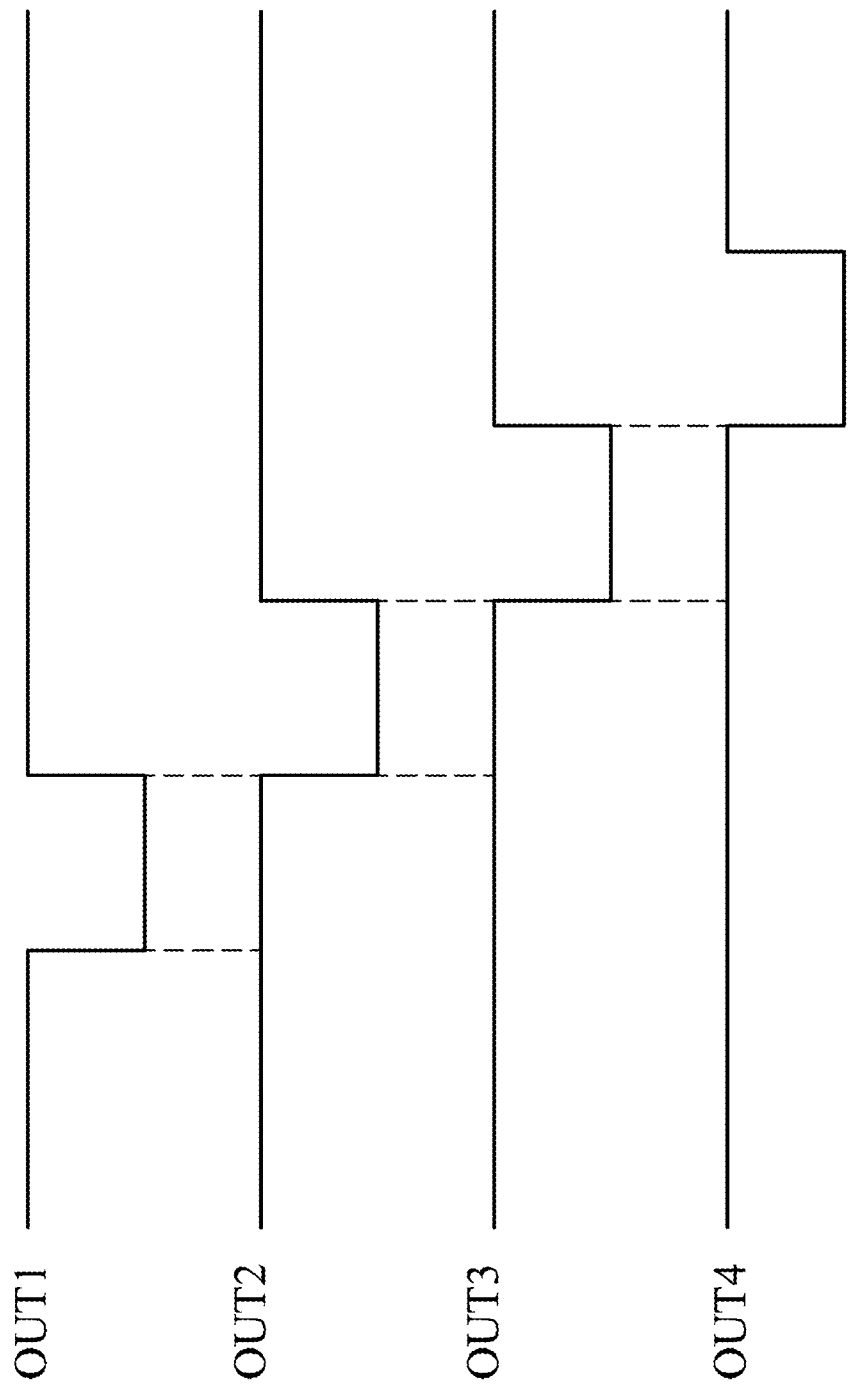

US 8,199,871 B2

ELECTRONIC SYSTEM WITH SHIFT REGISTER

CROSS REFERENCE TO RELATED APPLICATIONS

This application claims priority of Taiwan Patent Application No. 98141855, filed on Dec. 8, 2009, the entirety of which is incorporated by reference herein.

BACKGROUND OF THE INVENTION

1. Field of the Invention

The invention relates to an electronic system, and more particularly to an electronic system including a shift register.

2. Description of the Related Art

FIG. 1 is a schematic diagram of a conventional shift register. The shift register 100 is composed of D-type flip-flops 101-104. The D-type flip-flops 101-104 are connected in series with one another. The D-type flip-flops 101-104 shift a start signal START according to rising edges of a clock signal CLK.

FIG. 2 is a schematic diagram of another conventional shift register. The shift register 200 comprises shift register cells 201-204. The shift register cells 201-204 shift a start signal START according to clock signals CLK and XCLK.

BRIEF SUMMARY OF THE INVENTION

An exemplary embodiment of an electronic system comprises a power transforming unit and a display panel. The power transforming unit provides an operational voltage. The display panel receives the operational voltage and comprises a gate driver, a source driver, a first pixel and a second pixel. The gate driver is coupled to a first gate line and a second gate line and comprises a shift register and a signal generating unit. The shift register comprises a first transistor, a first trigger circuit, a second transistor, and a second trigger circuit. The first transistor receives a first input signal. The first trigger circuit is serially connected to the first transistor between a first level and a second level and is connected with the first transistor in a first node. The second transistor receives a second input signal inverted to the first input signal. The second trigger circuit receives the level of the first node, is serially connected to the second transistor between a third level and the second level, and is connected with the second transistor in a second node. The signal generating unit provides the first, the second, and the third levels. The source driver is coupled to a first data line and a second data line. The first pixel is coupled to the first gate line and the first data line. The second pixel is coupled to the second gate line and the second data line.

A detailed description is given in the following embodiments with reference to the accompanying drawings.

BRIEF DESCRIPTION OF THE DRAWINGS

The invention can be more fully understood by referring to the following detailed descriptions and examples with references made to the accompanying drawings, wherein:

FIG. 3B is a timing diagram of the output signals OUT1-OUT4;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
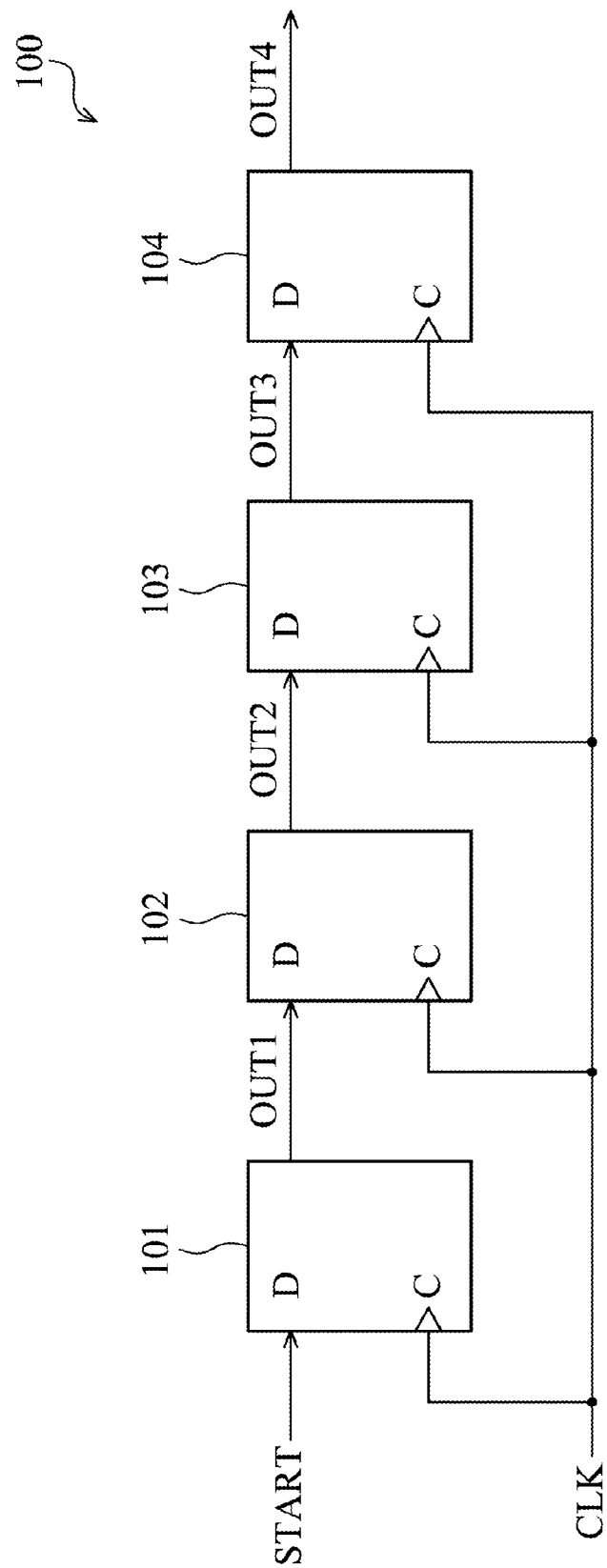
FIG. 1 is a schematic diagram of a conventional shift register.
Figure 2:
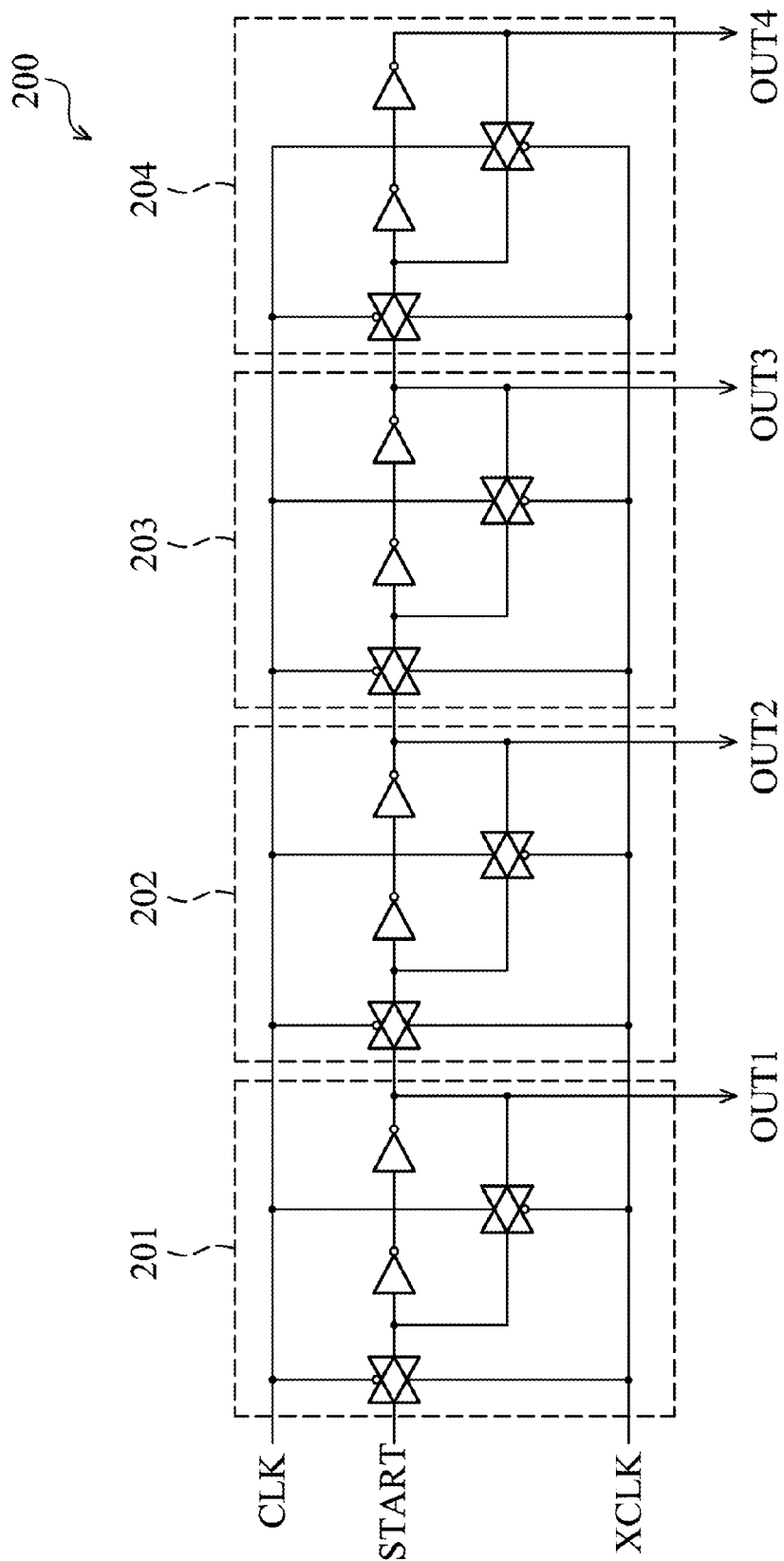
FIG. 2 is a schematic diagram of another conventional shift register.
Figure 3A:
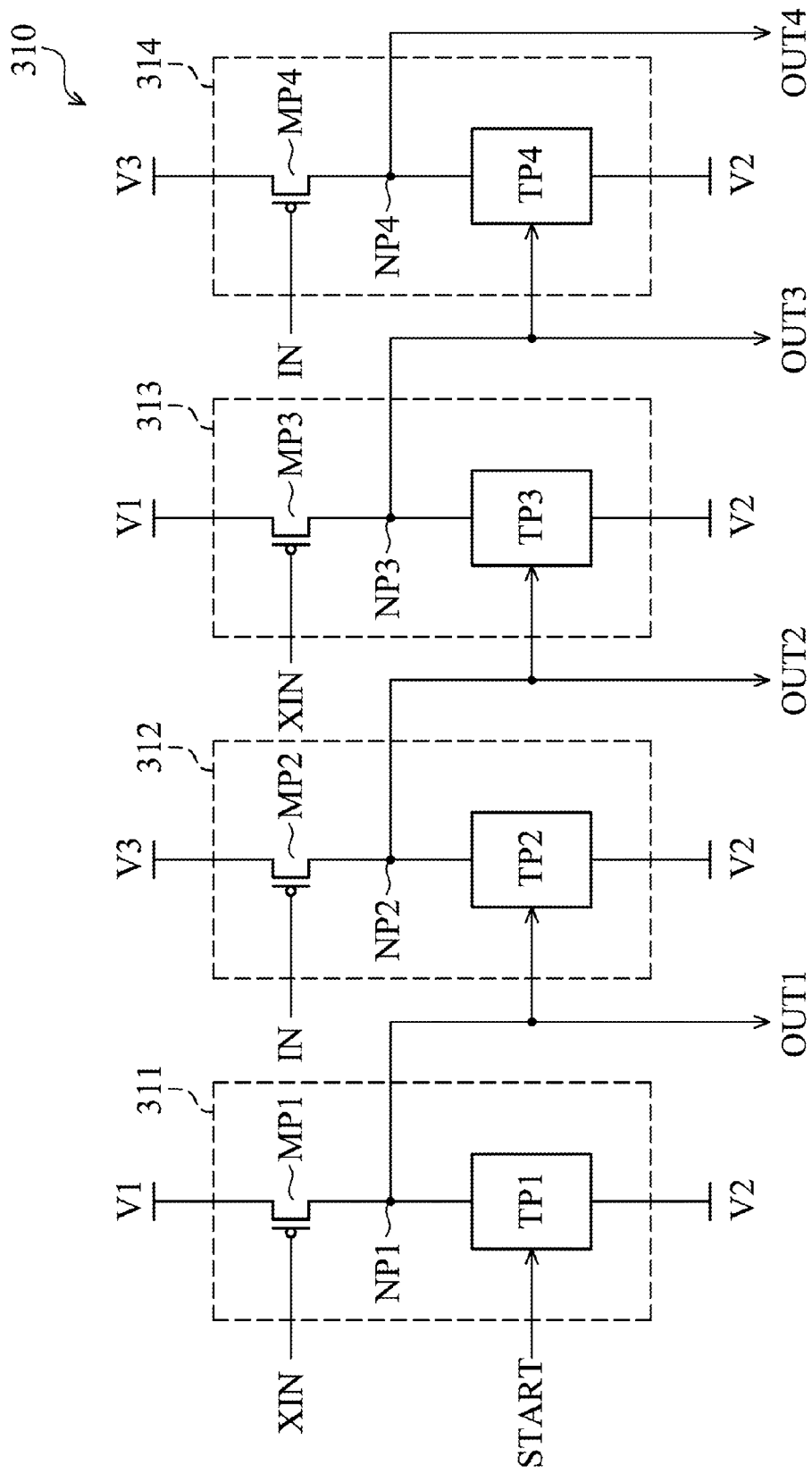
FIG. 3A is a schematic diagram of an exemplary embodiment of a shift register of the invention.

FIG. 3A is a schematic diagram of an exemplary embodiment of a shift register of the invention. The shift register comprises various shift register cells. The invention does not limit the number of the shift register cells. For clarity, FIG. 3A only shows four shift register cells 311-314.

As shown in FIG. 3A, the shift register cell 311 comprises a transistor MP1 and a trigger circuit TP1. The transistor MP1 receives an input signal XIN. The trigger circuit TP1 and the transistor MP1 are coupled to a node NP1. The trigger circuit TP1 is serially connected to the transistor MP1 between levels V1 and V2. In one embodiment, the level V1 is an alternating current (AC) level and inverted to the input signal XIN. In addition, the level V2 is maintained in a low level, such as a grounding level.

When a start signal START activates the trigger circuit TP1, the trigger circuit TP1 outputs the level V2 to the node NP1. When the start signal START does not activate the trigger circuit TP1, the transistor MP1 outputs the level V1 to the node NP1.

The shift register cell 312 comprises a transistor MP2 and a trigger circuit TP2. The transistor MP2 receives an input signal IN. The trigger circuit TP2 and the transistor MP2 are coupled to a node NP2. The trigger circuit TP2 is serially connected to the transistor MP2 between levels V3 and V2. In one embodiment, the level V3 is an AC level and inverted to the input signal IN. In this embodiment, the input signal IN is inverted to the input signal XIN. In one embodiment, the level V1 is the same as the input signal IN and the level V3 is the same as the input signal XIN.

When the level (i.e. an output signal OUT1) of the node NP1 is sufficient to activate the trigger circuit TP2, the trigger circuit TP2 outputs the level V2 to the node NP2. When the level of the node NP1 is not sufficient to activate the trigger circuit TP2, the transistor MP2 outputs the level V3 to the node NP2.

The shift register cell 313 comprises a transistor MP3 and a trigger circuit TP3. The transistor MP3 receives the input signal XIN. The trigger circuit TP3 is connected with the transistor MP3 in a node NP3. The trigger circuit TP3 is serially connected to the transistor MP3 between the levels V1 and V2. Since a function of the level of the node NP3 is similar to a function of the level of the node NP1, the description of the function of the level of the node NP3 is omitted for brevity.

The shift register cell 314 comprises a transistor MP4 and a trigger circuit TP4. The transistor MP4 receives the input signal IN. The trigger circuit TP4 and the transistor MP4 are coupled to a node NP4. The trigger circuit TP4 is serially connected to the transistor MP4 between the levels V3 and V2. Since a function of the level of the node NP4 is similar to a function of the level of the node NP2, the description of the function of the level of the node NP4 is omitted for brevity.

In this embodiment, the transistors MP1-MP4 are P-type transistors. As shown in FIG. 3A, the gates of the transistors MP1 and MP3 receive the input signal XIN. The sources of the transistors MP1 and MP3 receive the level V1. The drain of the transistor MP1 is coupled to the node NP1. The drain of the transistor MP3 is coupled to the node NP3. The gates of the transistors MP2 and MP4 receive the input signal IN. The sources of the transistors MP2 and MP4 receive the level V3. The drain of the transistor MP2 is coupled to the node NP2. The drain of the transistor MP4 is coupled to the node NP4.

Furthermore, the levels of the nodes NP1-NP4 are served as output signals OUT1-OUT4 of the shift register 310, respectively. FIG. 3B is a timing diagram of the output signals OUT1-OUT4. When a trigger circuit is activated, a corresponding output signal is equal to a low level (i.e. the level V2). When the trigger circuit is not activated, a corresponding output signal is equal to a high level. In this embodiment, only one output signal is equal to the low level at the same time.

Figure 4A:
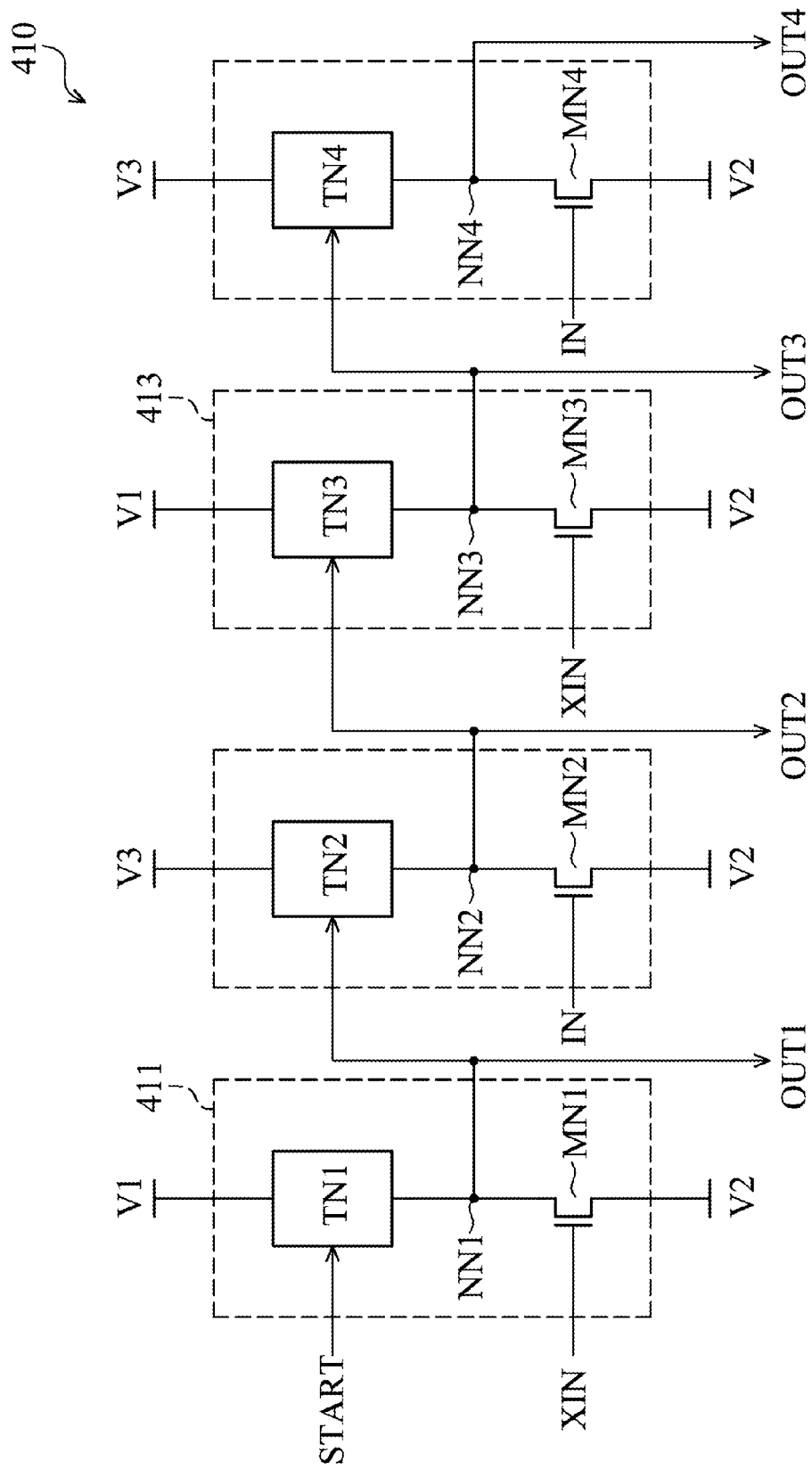
FIG. 4A is a schematic diagram of another exemplary embodiment of a shift register of the invention.

FIG. 4A is a schematic diagram of another exemplary embodiment of a shift register of the invention. FIG. 4A is similar to FIG. 3A with the exception that trigger circuits TN1-TN4 are coupled to N-type transistors MN1-MN4, respectively. Taking the transistors MN1 and MN3 as an example, the gates of the transistors MN1 and MN3 receive the input signal XIN. The sources of the transistors MN1 and MN3 receive the level V2. The drain of the transistor MN1 is coupled to the node NN1. The drain of the transistor MN3 is coupled to the node NN3. Additionally, the gates of the transistors MN2 and MN4 receive the input signal IN. The sources of the transistors MN2 and MN4 receive the level V2. The drain of the transistor MN2 is coupled to the node NN2. The drain of the transistor MN4 is coupled to the node NN4.

When the start signal START activates the trigger circuit TN1, the trigger circuit TN1 outputs the level V1 to the node NN1. When the start signal START does not activate the trigger circuit TN1, the transistor MN1 outputs the level V2 to the node NN1. Similarly, when the level (i.e. the output signal OUT1) of the node NN1 is sufficient to activate the trigger circuit TN2, the trigger circuit TN2 outputs the level V3 to the node NN2. When the level of the node NN1 is not sufficient to activate the trigger circuit TN2, the transistor MN2 outputs the level V2 to the node NN2.

Figure 4B:
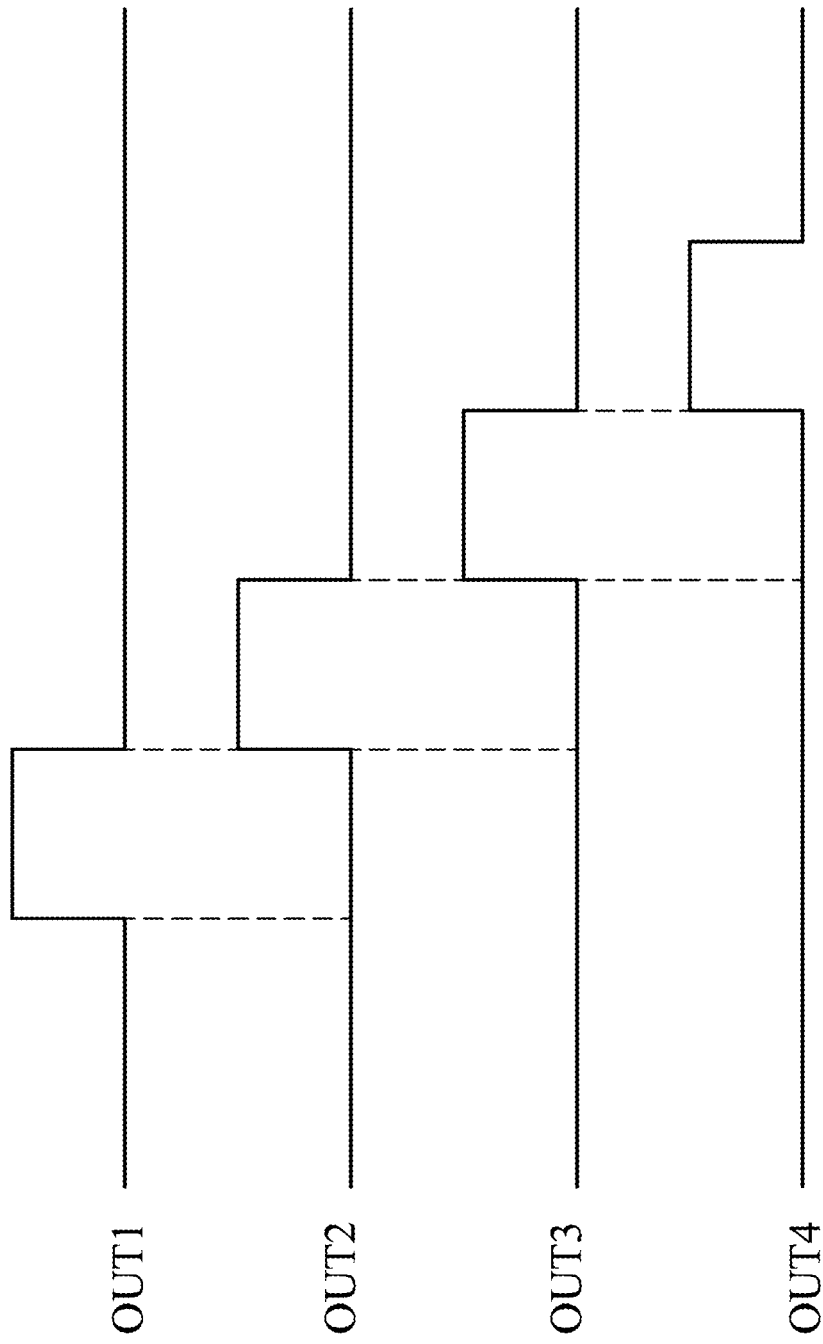
FIG. 4B is a timing diagram of the output signals OUT1-OUT4 shown in FIG. 4A.

Furthermore, the levels of the nodes NN1-NN4 are served as the output signals OUT1-OUT4 of the shift register 410. FIG. 4B is a timing diagram of the output signals OUT1-OUT4 shown in FIG. 4A. In this embodiment, when a trigger circuit is activated, a corresponding output signal is in a high level. When the trigger circuit is not activated, the corresponding output signal may be in a low level. As shown in FIG. 4B, only one output signal is in the high level at the same time. In other words, only one trigger circuit is activated at the same time.

Figure 5:
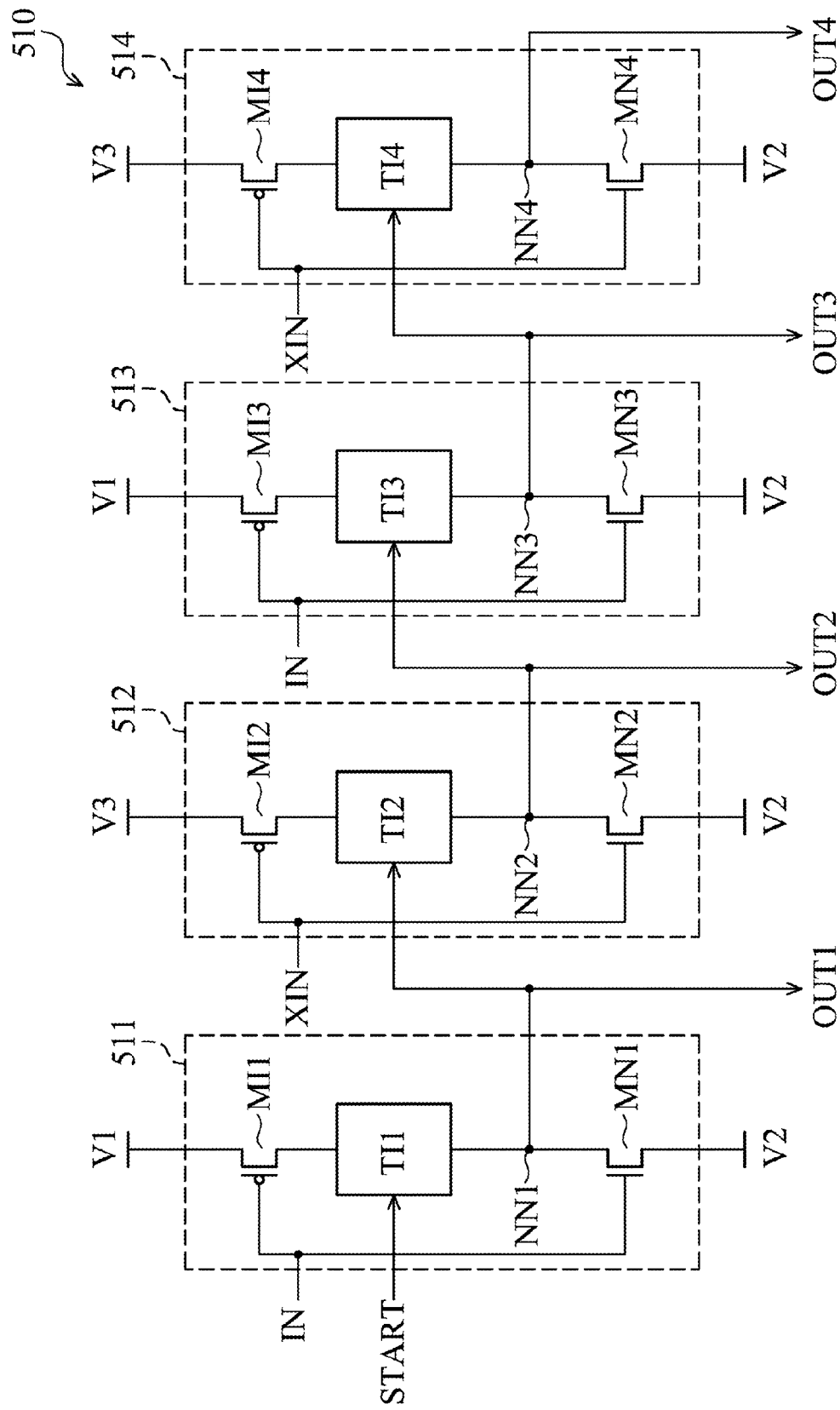
FIG. 5 is a schematic diagram of another exemplary embodiment of a shift register of the invention.

FIG. 5 is a schematic diagram of another exemplary embodiment of a shift register of the invention. FIG. 5 is similar to FIG. 4A with the exception that shift register cells 511-514 comprise P-type transistors MI1-MI4, respectively. Further, the levels V1 and V3 shown in FIG. 5 are different from the levels V1 and V3 shown in FIG. 4A. The levels V1 and V3 shown in FIG. 5 are direct current (DC) levels.

In this embodiment, the levels V1 and V3 shown in FIG. 5 are high, such as 10V and the level V2 is low, such as 0V. Additionally, the input signal IN of FIG. 5 is inverted to the input signal XIN of FIG. 5. The input signals IN and XIN are AC signals.

The shift register cell 511 comprises transistors MI1 and MN1, and a trigger unit TI1. The transistors MI1 and MN1 are serially connected to the trigger unit TI1 between the levels V1 and V2. The trigger unit TI1 and the transistor MN1 are coupled to the node NN1. The gates of the transistors MI1 and MN1 receive the input signal IN.

In this embodiment, the source of the transistor MI1 receives the level V1 and the source of the transistor MN1 receives the level V2. When the start signal START activates the trigger unit TI1, the level of the node NN1 is equal to the level V1. When the start signal START does not activate the trigger unit TI1, the level of the node NN1 is equal to the level V2.

The shift register cell 512 comprises transistors MI2 and MN2, and a trigger unit TI2. The transistors MI2 and MN2 are serially connected to the trigger unit TI2 between the levels V3 and V2. The trigger unit TI2 and the transistor MN2 are coupled to the node NN2. The gates of the transistors MI2 and MN2 receive the input signal XIN.

In this embodiment, the source of the transistor MI2 receives the level V3 and the source of the transistor MN2 receives the level V2. When the level of the node NN1 is sufficient to activate the trigger unit TI2, the level of the node NN2 is equal to the level V3. When the level of the node NN1 is not sufficient to activate the trigger unit TI2, the level of the node NN2 is equal to the level V2.

The shift register cell 513 comprises transistors MI3 and MN3, and a trigger unit TI3. The transistors MI3 and MN3 are serially connected to the trigger unit TI3 between the levels V1 and V2. The trigger unit TI3 and the transistor MN3 are coupled to the node NN3. The gates of the transistors MI3 and MN3 receive the input signal IN. In this embodiment, the source of the transistor MI3 receives the level V1 and the source of the transistor MN3 receives the level V2.

The shift register cell 514 comprises transistors MI4 and MN4, and a trigger unit TI4. The transistors MI4 and MN4 are serially connected to the trigger unit TI4 between the levels V3 and V2. The trigger unit TI4 and the transistor MN4 are coupled to the node NN4. The gates of the transistors MI4 and MN4 receive the input signal XIN. In this embodiment, the source of the transistor MI4 receives the level V3 and the source of the transistor MN4 receives the level V2.

As shown in FIG. 5, the structures of all shift register cells are the same (e.g. each shift register cell comprises a P-type transistor, an N-type transistor, and a trigger unit). In some embodiment, any particular shift register cell in FIG. 5 can be replaced by anyone shift register cell in FIG. 3A or FIG. 4A, or any particular shift register cell in FIG. 3A or FIG. 4A can be replaced by anyone shift register cell in FIG. 5.

The shift register cells in FIGS. 3A, 4A, and 5A execute a shifting action according to a small amount of input signals. Thus, complexity of the shift register can be reduced. Taking the shift register cell 311 shown in FIG. 3A as an example, the shift register cell 311 shifts the start signal START to generate the output signal OUT1 according to the input signal XIN and the levels V1 and V2.

In one embodiment, the input signal XIN is inverted to the level V1. In other words, one inverter is utilized to invert one of the input signals XIN and the level V1 to generate an inverted input signal. Thus, the complexity of the shift register is reduced.

Figure 6A:
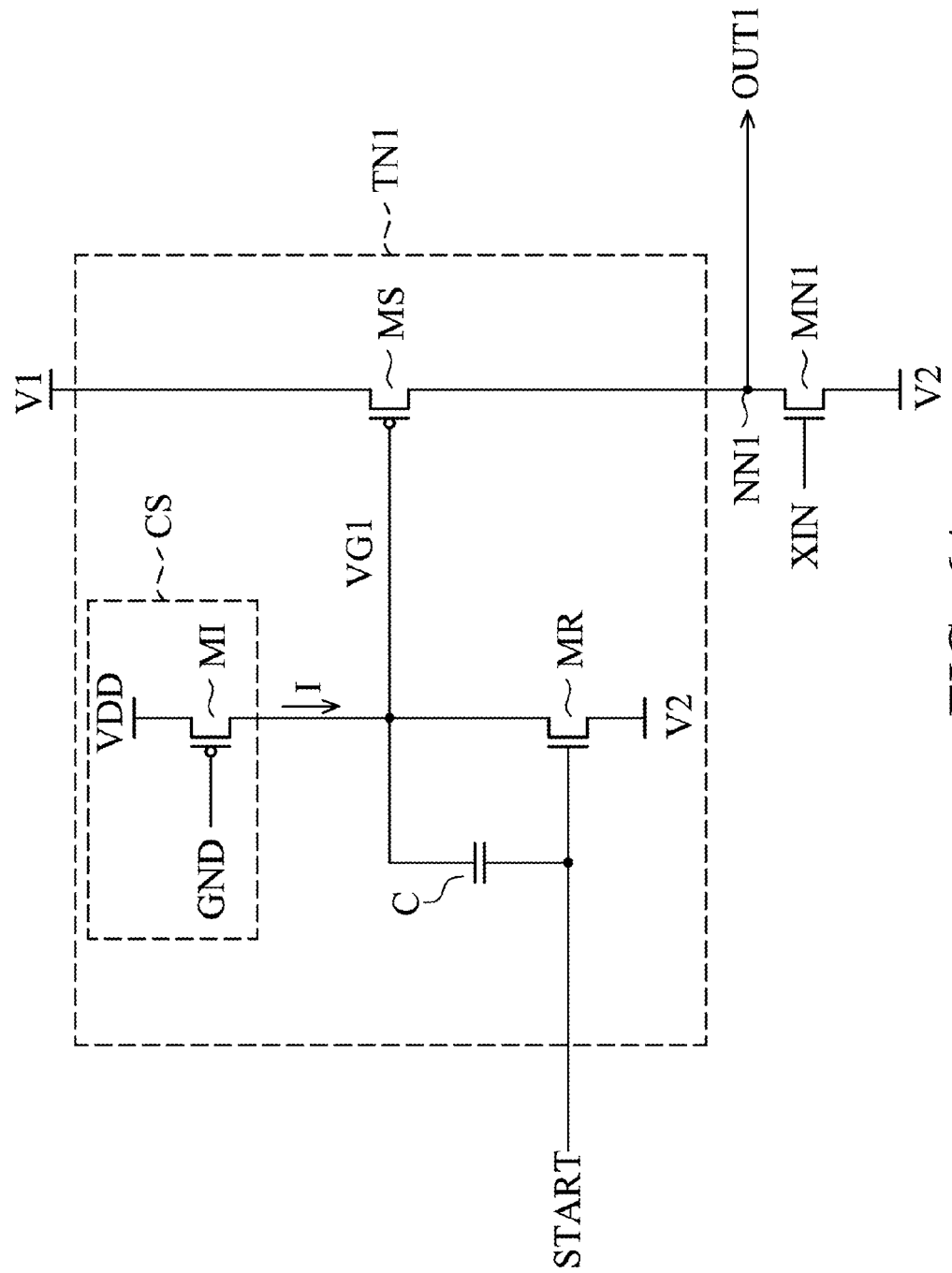
FIG. 6A is a schematic diagram of an exemplary embodiment of the trigger circuit shown in FIG. 3A and FIG. 4A.

FIG. 6A is a schematic diagram of an exemplary embodiment of the trigger circuit shown in FIG. 3A and FIG. 4A. The trigger circuit shown in FIG. 3A or 4A can be replaced by the trigger circuit shown in FIG. 6A. For clarity, FIG. 6A only shows the shift register cell 411 of FIG. 4A to describe a connection relationship between the trigger circuit TN1 and the transistor MN1.

As shown in FIG. 6A, the trigger circuit TN1 comprises a reset transistor MR and a capacitor C. The capacitor C is coupled between the gate and the drain of the reset transistor MR. In this embodiment, the reset transistor MR is an N-type transistor. Additionally, the trigger circuit TN1 further comprises a current source CS and a setting transistor MS.

The current source CS provides a fixed current I. In this embodiment, the current source CS consists of a P-type transistor MI. As shown in FIG. 6A, the gate of the transistor MI receives a grounding level GND and the source of the transistor MI receives a high voltage VDD to provide the fixed current I.

The setting transistor MS receives the level V1 and couples to the node NN1. In this embodiment, the setting transistor MS is utilized to increase the level of the node NN1 such that the level of the node NN1 is in a high level. Thus, the setting transistor MS is referred to as a pull-high transistor. In another embodiment, if the trigger circuit shown in FIG. 6A is applied in FIG. 3A, the setting transistor MS is coupled between the node NP1 and the level V2 to reduce the level of the node NP1 such that the level of the node NP1 is in a low level. AT this time, the setting transistor MS is referred to as a pull-low transistor.

Further, the start signal START shown in FIG. 6A represents an output signal of a previous shift register cell. The output signal OUT1 shown in FIG. 6A represents a signal transmitted to the next shift register. Taking the shift register cell 413 shown in FIG. 4A as an example, the start signal START shown in FIG. 6A is the output signal OUT2 shown in FIG. 4A. The output signal OUT1 shown in FIG. 6A is the output signal OUT3 shown in FIG. 4A.

Figure 6B:
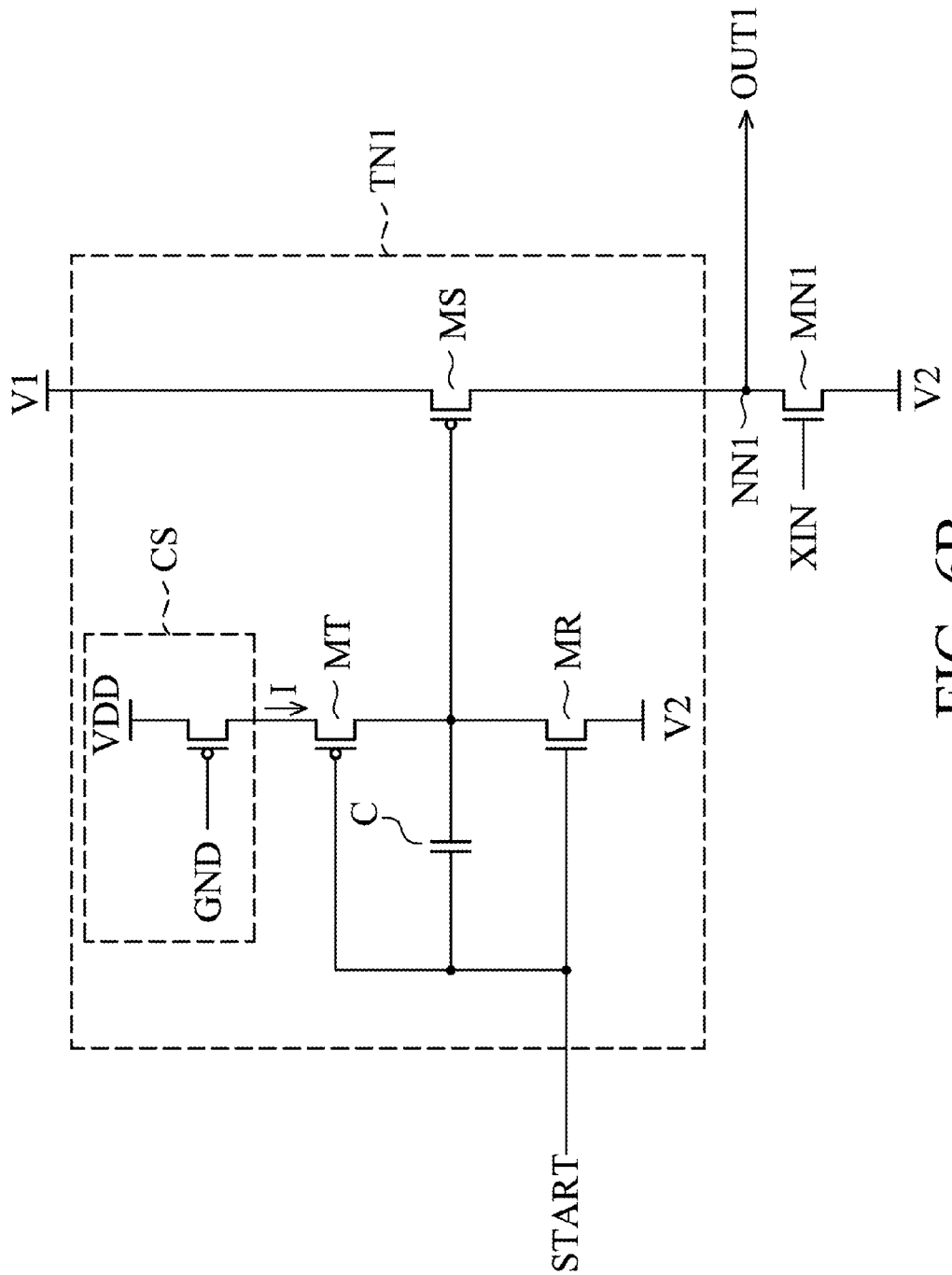
FIG. 6B a schematic diagram of another exemplary embodiment of the trigger circuit.

FIG. 6B a schematic diagram of another exemplary embodiment of the trigger circuit. FIG. 6B is similar to FIG. 6A except for the addition of a transmitting transistor MT. The transmitting transistor MT transmits the fixed current I to the capacitor C. In this embodiment, the reset transistor MR is an N-type transistor and the setting transistor MS and the transmitting transistor MT are P-type transistors.

The reset transistor MR comprises a gate receiving the start signal START, a source receiving the level V2, and a drain coupled to the drain of the transmitting transistor MT. The setting transistor MS comprises a gate coupled to the drain of the transmitting transistor MR, a drain coupled to the node NN1, and a source receiving the level V1. The transmitting transistor MT comprises a gate receiving the start signal START, a source coupled to the current source CS and a drain coupled to the drain of the reset transistor MR.

Figure 7:
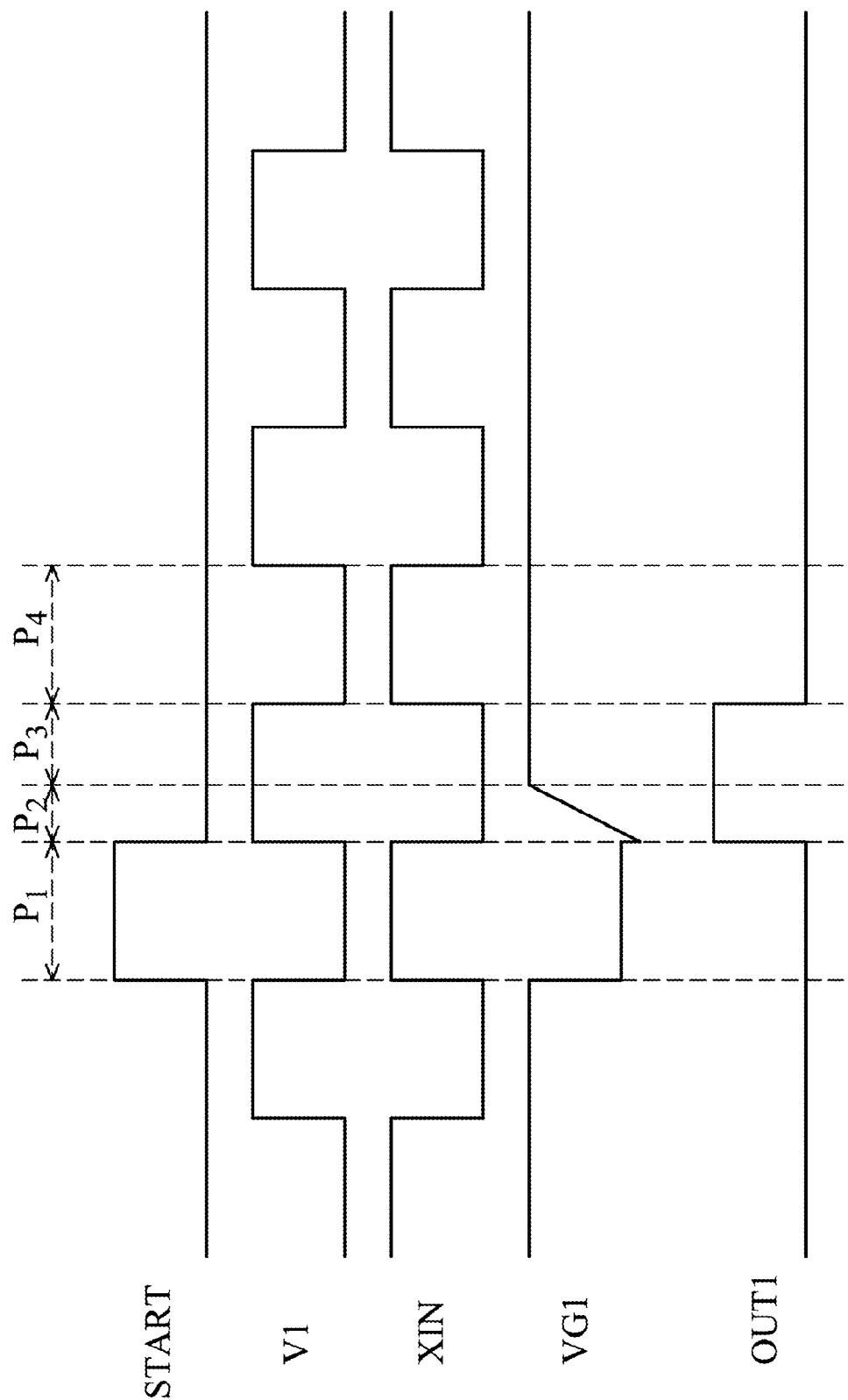
FIG. 7 shows a control timing diagram of the trigger circuit.

FIG. 7 shows a control timing diagram of the trigger circuit. Since the control timing of FIG. 6A is similar to the control timing of FIG. 6B, FIG. 7 only shows the control timing of FIG. 6A. During the period $P_1$, the start signal START is in a high level such that the reset transistor MR is turned on to reset the capacitor C. At this time, the gate voltage VG1 of the setting transistor MS is low. Since the level V1 is a low level, the setting transistor MS is turned off. During the period $P_1$, the input signal XIN is a high level such that the transistor MN1 is turned on.

During the period $P_2$, the start signal is low, the transmitting transistor MR is turned off. Thus, the current source CS charges the capacitor C. During the period $P_2$, the gate voltage VG1 of the setting transistor MS is lower than the low level at the very start because the reset transistor MR is controlled from a turn-on state to a turn-off state. Then, the gate voltage VG1 of the setting transistor MS is gradually increased because the capacitor C is charged. During the period $P_2$, the setting transistor MS is turned on. Since the level V1 is high, the setting transistor MS pulls the level (i.e. the output signal OUT1) of the node NN1 to a high level. At this time, since the input signal XIN is low, the transistor MN1 is turned off.

During the period $P_3$, the charge of the capacitor C is maintained in a preset value. Thus, the gate voltage VG1 of the setting transistor MS is high. At this time, the reset transistor MR, the setting transistor MS, and the transistor MN1 are turned off.

During the period $P_4$, the input signal XIN is high such that the transistor MN1 is turned on. Thus, the output signal OUT1 is low. At this time, the reset transistor MR and the setting transistor MS are turned off.

Referring to FIG. 7, the start signal START is shifted by the shift register of the invention. The shifted result is shown as the output signal OUT1. Since the shift register of the invention arrives to a shift function according to a small number of control signals. Thus, the complexity of the shift register can be reduced.

For example, the shift register 310 shown in FIG. 3A shifts the start signal START according to the levels V1-V3 and the input signals XIN and IN. In one embodiment, when the level V1 is inverted to the level V2, only one level (e.g. V1) is required and utilized to generate the invented level (e.g. V2). In another embodiment, when the level V1 is equal to the input signal IN and the level V2 is equal to the input XIN, only one level (e.g. V1) is required and utilized to generate the inverted level (e.g. V2 and XIN) and the non-inverted level (e.g. IN).

The invention does not limit the application field of the shift register. In one embodiment, the shift register is applied within a gate driver or a data driver of a display panel, but the disclosure is not limited thereto. In other embodiments, the shift register is combined with other circuits. For brevity, a gate driver is given as an example.

Figure 8A:
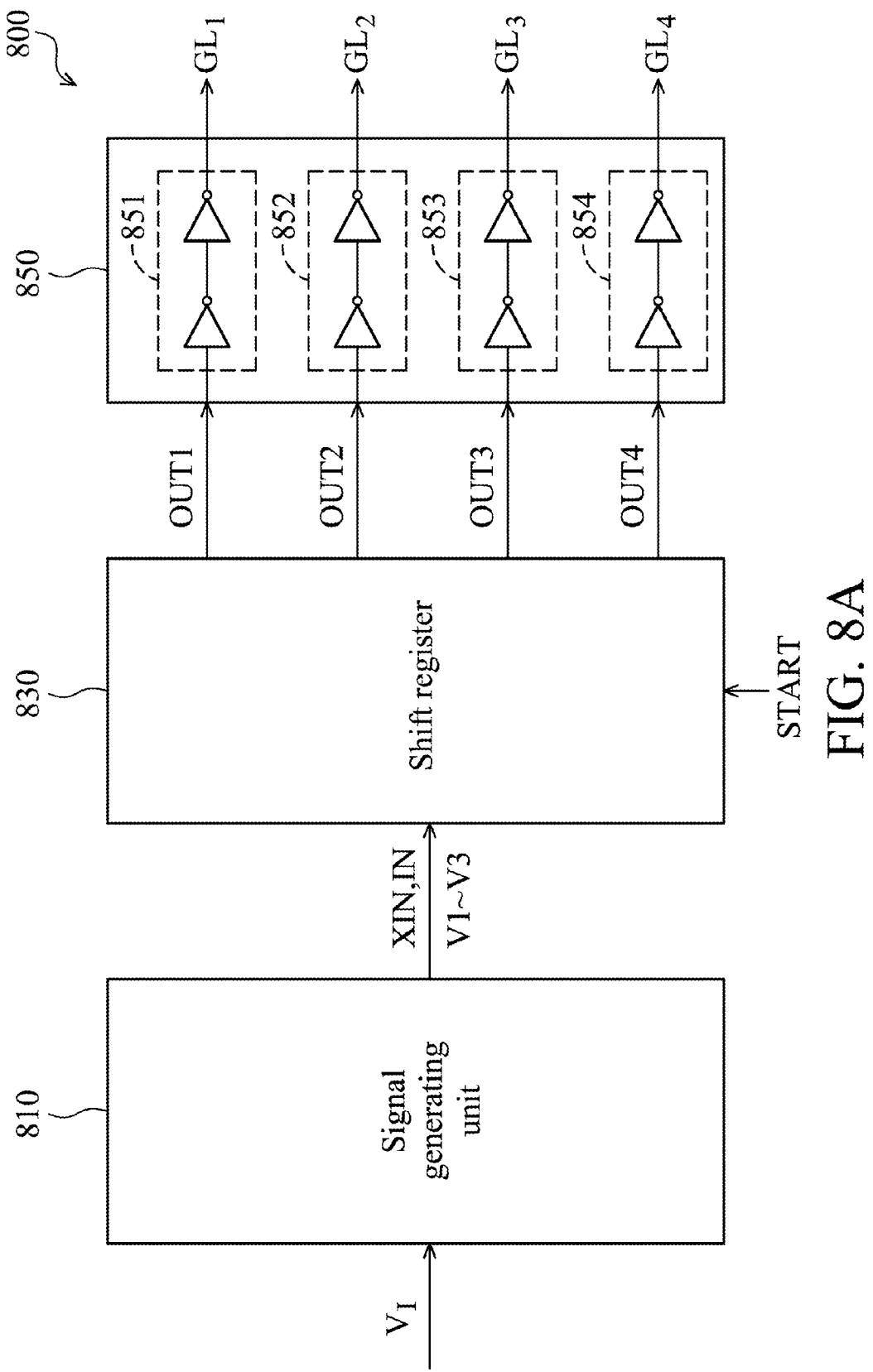
FIG. 8A a schematic diagram of an exemplary embodiment of a gate driver.

FIG. 8A a schematic diagram of an exemplary embodiment of a gate driver. The gate driver 800 is coupled to gate lines $GL_1$-$GL_4$. The invention does not limit the number of the gate lines. In this embodiment, only four gate lines are shown, but the disclosure is not limited thereto. Further, the gate driver 800 comprises a signal generating unit 810, a shift register 830, and a buffer unit 850.

The signal generating unit 810 generates input signals XIN and IN and levels V1-V3 according to input voltage $V_I$. In one embodiment, the signal generating unit 810 is a level shifter. In another embodiment, the input signal XIN is inverted to the input signal IN. In this embodiment, the input signals XIN and IN are AC signals. In other embodiments the level V1 is inverted to or equal to the level V2. In other words, the levels V1 and V2 are AC levels or DC levels.

The shift register 830 receives the signals output from the signal generating unit 810 to shift a start signal START. The shift register 830 may be the shift register shown in FIG. 3A, FIG. 4A, and FIG. 5. The invention does not limit the structure of each shift register cell. In one embodiment, the structures of all shift register cells are the same. In another embodiment, the structures of a portion of shift register cells may be different from the structures of the remainder.

The buffer unit 850 increases the driving capability of the output signals OUT1-OUT4 of shift register 830 such that the output signals OUT1-OUT4 of shift register 830 is capable of driving the pixels coupled to the gate lines $GL_1$-$GL_4$. In this embodiment, the buffer unit 850 comprises buffer strings 851-854. The buffer strings 851-854 are composed of various buffers.

Figure 8B:
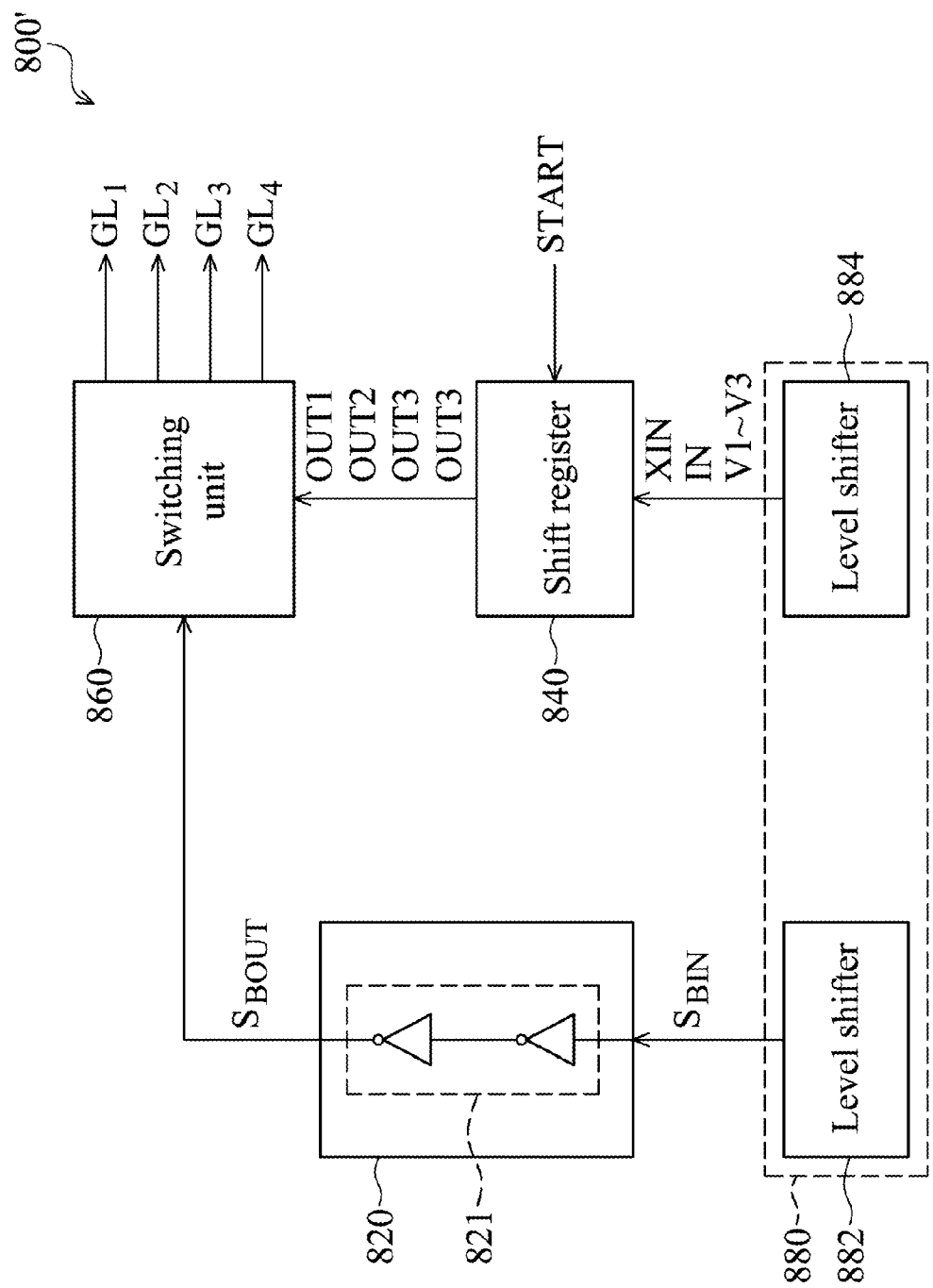
FIG. 8B a schematic diagram of another exemplary embodiment of a gate driver.

FIG. 8B a schematic diagram of another exemplary embodiment of a gate driver. The gate driver 800' comprises a buffer unit 820, a shift register 840, a switching unit 860 and a signal generating unit 880. In this embodiment, the shift register 840 is the shift registers shown in FIG. 3A, FIG. 4A and FIG. 5.

The signal generating unit 880 comprises level shifters 882 and 884. The level shifter 882 generates a signal $S_{BIN}$ to a buffer string 821. The level shifter 884 generates input signals XIN and IN and levels V1-V3 to the shift register 840. In other embodiments, the signal generating unit 880 may comprise a single level shifter to generate signals required by the buffer unit 820 and the shift register 840.

The buffer string 821 amplifies the driving capability of the signal $S_{BIN}$ and serves the amplified signal as an output signal $S_{BOUT}$. The output signal $S_{BOUT}$ is transmitted to the switching unit 860. The switching unit 860 selectively transmits the output signal $S_{BOUT}$ to the gate lines $GL_1$-$GL_4$ according to the output signals OUT1-OUT4 of the shift register 840.

In this embodiment, since the buffer unit 820 only comprises a single buffer string (i.e. 821), the size of the gate driver 800' can be substantially reduced. Additionally, the start signal START received by the shift register 840 can be provided by a timing controller (not shown), but the disclosure is not limited thereto.

Figure 9:
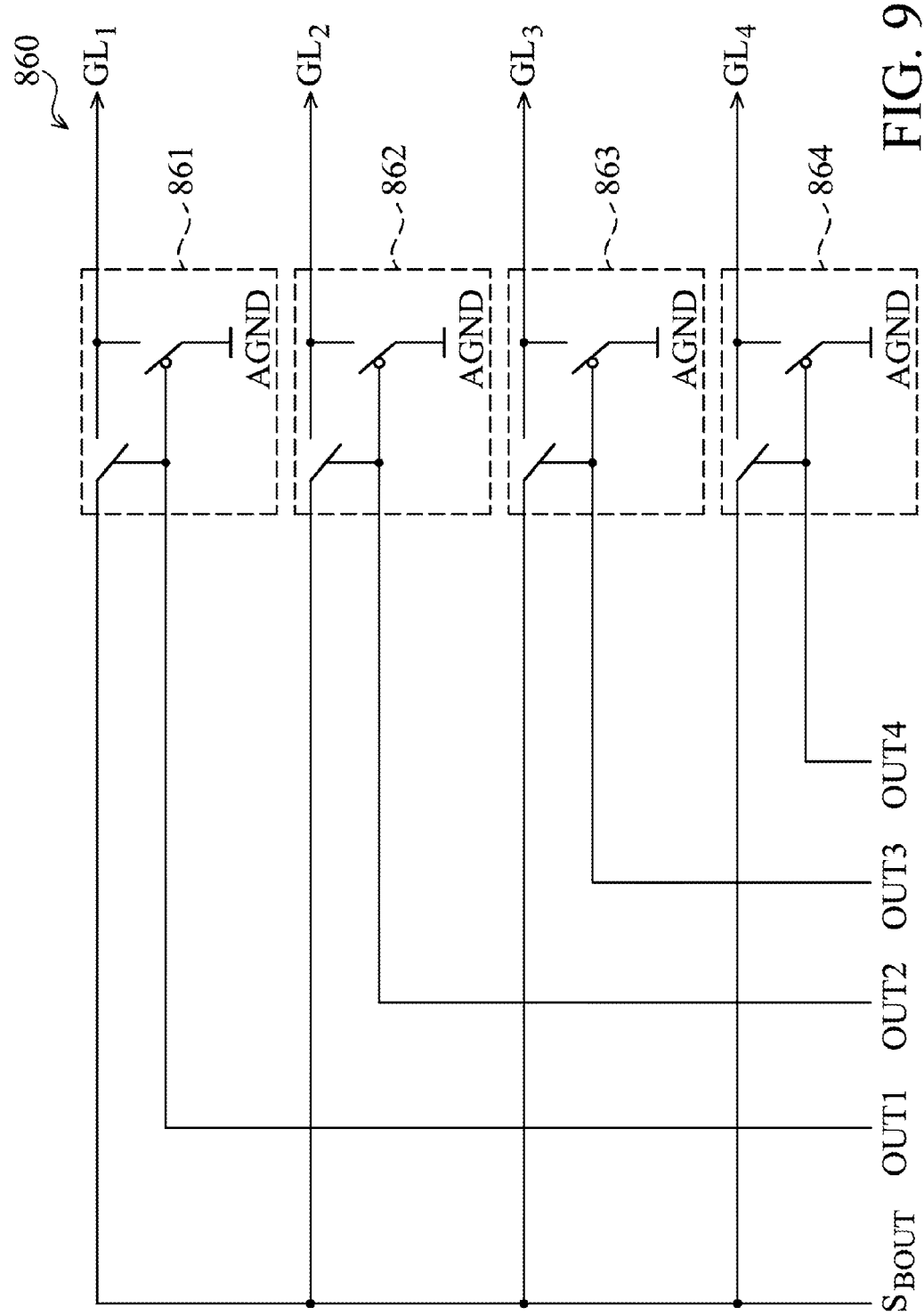
FIG. 9 a schematic diagram of an exemplary embodiment of the switching unit shown in FIG. 8.

FIG. 9 a schematic diagram of an exemplary embodiment of the switching unit shown in FIG. 8. The switching unit 860 comprises switches 861-864. The switches 861-864 are controlled by the output signals OUT1-OUT4 of the shift register 840. For example, assuming the output signals OUT1-OUT4 shown in FIG. 9 are the output signals OUT1-OUT4 shown in FIG. 4B.

When the output signal OUT1 is in a high level, the switch 861 transmits the output signal $S_{BOUT}$ of the buffer string 821 to the gate line $GL_1$. At this time, switches 862-864 transmit low levels AGND to the gate lines $GL_2$-$GL_4$. Thus, the levels of the gate lines $GL_2$-$GL_4$ are low. Similarly, when the output signal OUT2 is in a high level, the switch 862 transmits the output signal $S_{BOUT}$ of the buffer string 821 to the gate line $GL_2$. At this time, switches 861, 863 and 864 transmit low levels AGND to the gate lines $GL_1$, $GL_3$ and $GL_4$.

The gate drivers shown in FIG. 8A and FIG. 8B can be applied to an electronic system. The electronic system may be a personal digital assistant (PDA), a cellular phone, a digital camera (DSC), a television, a global positioning system (GPS), a car display, an avionics display, a digital photo frame, a notebook computer (NB), a personal computer (PC).

Figure 10:
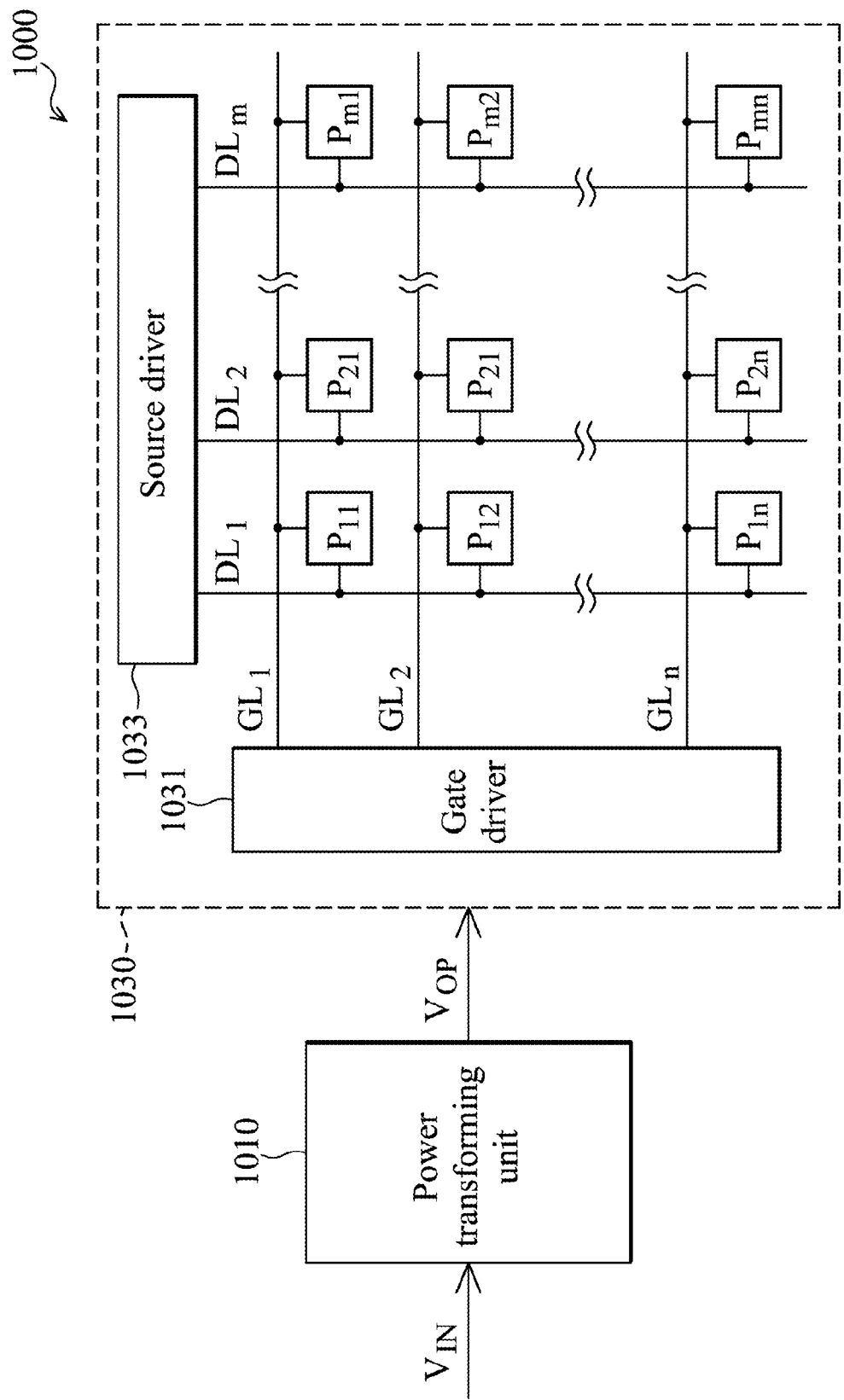
FIG. 10 a schematic diagram of an exemplary embodiment of an electronic system.

FIG. 10 a schematic diagram of an exemplary embodiment of an electronic system. The electronic system 1000 comprises a power transforming unit 1010 and a display panel 1030. The power transforming unit 1010 converts an input power $V_{IN}$ to generate an operation voltage $V_{OP}$. The display panel 1030 receives the operation voltage $V_{OP}$ to display an image. In one embodiment, the input power $V_{IN}$ is an AC power or a DC power. In this embodiment, the operation voltage $V_{OP}$ is a DC voltage.

The display panel 1030 comprises a gate driver 1031, a source driver 1033 and pixels $P_{11}$~$P_{mn}$. The gate driver 1031 provides scan signals to gate lines $GL_1$~$GL_n$. The source driver 1033 provides data signals to data lines $DL_1$~$DL_n$. The pixels $P_{11}$~$P_{mn}$ receives the data signals according to the scan signals of the gate lines $GL_1$~$GL_n$ and display the corresponding brightness according to the data signals.

In one embodiment, the gate driver 1031 sequentially activates the gate lines $GL_1$~$GL_n$. Thus, the gate driver 1031 requires a shift register. In another embodiment, the source driver 1033 sequentially provides data signals to data lines $DL_1$~$DL_n$. Thus, the source driver 1033 also requires a shift register. The gate driver 1031 and the source driver 1033 can utilize the shift register shown in FIG. 3A, FIG. 4A or FIG. 5. In addition, since the application of the scan signals provided by the gate driver 1031 and the application of the data signals provided by the source driver 1033 are well known to those skilled in the field, such descriptions are omitted for brevity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic system, comprising:
a power transforming unit providing an operation voltage;
a display panel receiving the operation voltage and comprising:
a gate driver coupled to a first gate line and a second gate line, comprising:
a shift register comprising:
a first transistor receiving a first input signal;
a first trigger circuit serially connected to the first transistor between a first level and a second level and connected with the first transistor in a first node;
a second transistor receiving a second input signal inverted to the first input signal; and
a second trigger circuit receiving the level of the first node, serially connected to the second transistor between a third level and the second level, and connected with the second transistor in a second node; and
a signal generating unit providing the first, the second, and the third levels;
a source driver coupled to a first data line and a second data line;
a first pixel coupled to the first gate line and the first data line; and
a second pixel coupled to the second gate line and the second data line.

2. The electronic system as claimed in claim 1, wherein the signal generating unit is a level shifter providing the first and the second input signals, the gate driver further comprises a buffer unit comprising a first buffer string and a second buffer string, the first buffer string is coupled between the shift register and the first gate line is coupled between the shift register and the second gate line to increase the driving capability of the level of the second node.

3. The electronic system as claimed in claim 1, wherein the gate driver further comprises a switching unit coupled between a buffer string and the first gate line and coupled between the buffer string and the second gate line to selectively transmit an output signal of the buffer string to the first or the second gate line according to the levels of the first and the second nodes, and an input signal of the buffer string is provided by the signal generating unit.

4. The electronic system as claimed in claim 3, wherein the switching unit comprises:
   a first switch transmitting the output signal of the buffer string to the first gate line according to the level of the first node;
   a second switch transmitting the output signal of the buffer string to the second gate line according to the level of the second node;
   wherein the signal generating unit comprises:
   a first level converter providing the first, the second, and the third levels and the first and the second input signals;
   a second level converter providing the input signal of the buffer string.

5. The electronic system as claimed in claim 1, wherein the gate driver further comprises a buffer unit comprising a single buffer string and disposed without the gate driver.

6. The electronic system as claimed in claim 1, wherein the first level is the same as the second input signal, the third level is the same as the first input signal, and the first level is an alternating current (AC) level.

7. The electronic system as claimed in claim 6, wherein the first and the second transistors are P-type transistors;
   wherein the first transistor comprises a gate receiving the first input signal, a source receiving the first level, and a drain coupled to the first node, and the second transistor comprises a gate receiving the second input signal, a source receiving the third level, and a drain coupled to the second node;
   wherein when a start signal activates the first trigger circuit, the first trigger circuit outputs the second level to the first node, and when the start signal does not activate the first trigger circuit, the first transistor outputs the first level to the first node; and
   wherein when the level of the first node is sufficient to activate the second trigger circuit, the second trigger circuit outputs the second level to the second node, and when the level of the first node is not sufficient to activate the second trigger circuit, the second transistor outputs the third level to the second node.

8. The electronic system as claimed in claim 6, wherein the first and the second transistors are N-type transistors;
   wherein the first transistor comprises a gate receiving the first input signal, a source receiving the second level, and a drain coupled to the first node;
   wherein the second transistor comprises a gate receiving the second input signal, a source receiving the second level, and a drain coupled to the second node;
   wherein when a start signal activates the first trigger circuit, the first trigger circuit outputs the first level to the first node, and the start signal does not activates the first trigger circuit, the first transistor outputs the second level to the first node; and
   wherein when the level of the first node is sufficient to activate the second trigger circuit, the second trigger circuit outputs the third level to the second node, and when the level of the first node is not sufficient to activate the second trigger circuit, the second transistor outputs the second level to the second node.

9. The electronic system as claimed in claim 6, further comprising:
   a third transistor receiving the first input signal;
   a third trigger circuit receiving the level of the second node, serially connected to the third transistor between the first and the second levels, and connected with the third transistor in a third node;
   a fourth transistor receiving the second input signal; and
   a fourth trigger circuit receiving the level of the third level and serially connected to the fourth transistor between the third and the second levels.

10. The electronic system as claimed in claim 1, further comprising:
    a third transistor serially connected to the first transistor and the first trigger circuit between the first and the second levels;
    a fourth transistor serially connected to the second transistor and the second trigger circuit between the third and the second levels, wherein the first level is the same as the third level and is a direct current (DC) level, and the first input signal is an alternating current (AC) level.

11. The electronic system as claimed in claim 10, wherein the first and the second transistors are N-type transistors and the third and the fourth transistors are P-type transistor.

12. The electronic system as claimed in claim 11, wherein when a start signal activates the first trigger circuit, the level of the first node is equal to the first level, and when the start signal does not activate the first trigger circuit, the level of the first node is equal to the second level,
    wherein when the level of the first node is sufficient to activate the second trigger circuit, the level of the second node is equal to the third level, and when the level of the first node is not sufficient to activate the second trigger circuit, the level of the second node is equal to the second level.

13. The electronic system as claimed in claim 11, wherein the first trigger circuit comprises:
    a reset transistor;
    a capacitor coupled between a gate and a drain of the reset transistor;
    a current source providing a fixed current; and
    a setting transistor comprising a gate coupled to the current source, a source coupled to the third transistor, and a drain coupled to the first transistor.

14. The electronic system as claimed in claim 10, further comprising:
    a fifth transistor receiving the first input signal;
    a third trigger circuit receiving the level of the second node;
    a sixth transistor serially connected to the fifth transistor and the third trigger circuit between the first and the second levels and connected with the third trigger circuit in a third node;
    a seventh transistor receiving the second input signal;
    a fourth trigger circuit receiving the level of the third node;
    an eighth transistor serially connected to the seventh transistor and the fourth trigger circuit between the third and the second levels.

15. The electronic system as claimed in claim 14, wherein the fifth and the seventh transistors are P-type transistors and the sixth and the eighth transistors are N-type transistors.

16. The electronic system as claimed in claim 1, wherein the first trigger circuit comprises:
    a reset transistor;
    a capacitor coupled between the gate and the drain of the reset transistor;
    a current source providing a fixed current; and
    a setting transistor coupled to the first node, wherein when the first transistor is an N-type transistor, the setting transistor receives the first level, and when the first transistor is a P-type transistor, the setting transistor receives the second level.

17. The electronic system as claimed in claim 16, wherein during a first period, a start signal turns on the reset transistor to reset the capacitor and the first input signal turns on the first transistor, wherein during a second period, the start signal turns off the reset transistor, the current source charges the capacitor, and the charge of the capacitor turns on the setting transistor, wherein during a third period, the charge of the capacitor is maintained in a preset value and the setting transistor is turned off, wherein during a fourth period, the first input signal turns on the first transistor.

18. The electronic system as claimed in claim 17, wherein the reset transistor is an N-type transistor, the setting transistor is a P-type transistor, the reset transistor comprises a gate receiving the start signal and a source receiving the second level, and the setting transistor comprises a gate coupled to the drain of the reset transistor, a source receiving the first level, and a drain coupled to the first node.

19. The electronic system as claimed in claim 16, wherein the first trigger circuit further comprises a transmitting transistor to transmit the fixed current to the capacitor, the reset transistor is an N-type transistor, the setting transistor and the transmitting transistor are P-type transistors, the reset transistor comprises a gate receiving the start signal and a source receiving the second level, the setting transistor comprises a gate coupled to the drain of the reset transistor, a source receiving the first level, and a drain coupled to the first node, and the transmitting transistor comprises a gate receiving the start signal, a source coupled to the current source, and a drain coupled to the drain of the reset transistor.

20. The electronic system as claimed in claim 1, wherein the electronic system is a personal digital assistant (PDA), a cellular phone, a digital camera (DSC), a television, a global positioning system (GPS), a car display, an avionics display, a digital photo frame, a notebook computer (NB), a personal computer (PC).

* * * * *